United States Patent [19]

Polan et al.

[11] Patent Number: 4,956,053

[45] Date of Patent: Sep. 11, 1990

[54] APPARATUS AND PROCESS FOR THE PRODUCTION OF MICRO-PORE FREE HIGH DUCTILITY METAL FOIL

[75] Inventors: Ned W. Polan, Madison; Raymond J. Smialek, Cheshire; Paul Menkin, Branford, all of Conn.

[73] Assignee: Olin Corporation, New Haven, Conn.

[21] Appl. No.: 410,770

[22] Filed: Sep. 21, 1989

Related U.S. Application Data

[63] Continuation of Ser. No. 199,406, May 26, 1988, abandoned.

[51] Int. Cl.$^5$ .............................................. C25D 1/04
[52] U.S. Cl. ...................................................... 204/13
[58] Field of Search ........................................... 204/13

[56] References Cited

U.S. PATENT DOCUMENTS

| 1,417,464 | 5/1922 | Edison | 204/13 |
| 1,543,861 | 5/1924 | McCord | 204/13 |
| 2,044,415 | 6/1936 | Yates | 204/13 |
| 2,387,236 | 11/1966 | Brugger | 204/52 |
| 3,461,046 | 8/1969 | Clancy | 204/13 |
| 3,660,251 | 5/1972 | Flumann | 204/15 |
| 4,529,486 | 7/1985 | Polan | 204/13 |
| 4,549,950 | 10/1985 | Polan et al. | 204/206 |
| 4,647,345 | 3/1987 | Polan | 204/13 |

FOREIGN PATENT DOCUMENTS 0207244 7/1987 European Pat. Off. .

OTHER PUBLICATIONS

Electroplating Engineering Handbook, edited by A. Kenneth Graham, 1962, p. 724.
Copper Foil for Printed Wiring Application, published in the IPC Standard 1981 edition.

Primary Examiner—T. M. Tufariello
Attorney, Agent, or Firm—H. Samuel Kieser

[57] ABSTRACT

A process and apparatus for producing metal foil comprises supplying an isotopically polished continuous cathode, a high volume turbulent flow of electrolyte and rigorous filtration to exclude chlorides, sulfides, organics and other impurities from the electrolyte. The foil so produced is free from micro-voids and able to withstand substantially higher biaxial stresses than conventional electrodeposited foil. The micro void free structure also decreases the diffusion rate of an underlying substrate.

16 Claims, 3 Drawing Sheets

APPARATUS AND PROCESS FOR THE PRODUCTION OF MICRO-PORE FREE HIGH DUCTILITY METAL FOIL

This application is a continuation of application Ser. No. 199,406, filed May 26, 1988 abandoned.

The present invention relates to electroformed metal foil and a process for electrolytically producing foil. The metal foil so produced is essentially micro-pore free, free of inclusions and exhibits high ductility.

The production of electroformed or electrodeposited metal foil, especially copper foil, is of considerable importance because of its use in the production of printed circuits for electronic and electrical equipment As demonstrated by Edison U.S. Pat. No. 1,417,464 and McCord U.S. Pat. No. 1,543,861, the basic electroforming technology is old and well known in the art. Generally, the metal foil is formed by partially immersing and rotating a cylindrical cathode drum in an appropriate electrolyte and applying an electrical current between the cathode and an anode which is also at least partially immersed in the electrolyte. When the plated surface of the cylindrical cathode emerges from the electrolyte, the metal foil formed thereon is stripped from the surface and coiled on a roll.

To promote the formation of metal foil having uniform thickness, at least one stationary anode is mounted in the electrolytic cell concentric with the rotating drum cathode. In most electroforming systems used today, a split anode having a central passageway or manifold between the anode sections is employed. The passageway or manifold feeds electrolyte across the bottom of the rotating drum cathode and into the gap between the cathode and anode sections. This arrangement is intended to provide fresh electrolyte across the plating surface of the cathode. Yates U.S. Pat. No. 2,044,415, Clancy U.S. Pat. No. 3,461,046 and Polan U.S. Pat. No. 4,529,486 exemplify such systems.

Superior ductility is a highly desired property of the metal foil as is a minimum of pores or inclusions. One approach to increasing the ductility is to add stress relieving additives to the plating electrolyte such as thiourea compounds as disclosed in Brugger et al U.S. Pat. No. 3,287,236 other common additives to copper plating baths include hide glue, gelatin and hydrochloric acid. A method of increasing ductility without the use of plating additives is ultrasonic agitation of the electrolyte as disclosed in Polan U.S. Pat. No. 4,647,345.

Essentially pore free foil has been obtained by random polishing of the cathode drum to produce a generally isotropic surface finish as disclosed in U.S. patent application Ser. No. 161,819, entitled "CATHODE SURFACE TREATMENT FOR ELECTROFORMING METALLIC FOIL AND STRIP", by Polan, filed Feb. 29, 1988 which is a continuation of U.S. patent application Ser. No. 65,452 (now abandoned).

Pores and pin holes in the foil have also been reduced through the use of a dual filtration system to continuously remove particulate matter and surface impurities from the electrolyte. Such a filtration system has been disclosed in Polan et al U.S. Pat. No. 4,549,950.

In accordance with the present invention, an apparatus for forming essentially micro-pore free metal foil is provided. A process to electrolytically produce the foil is also provided. The apparatus includes an additive free electrolyte, a polished cathode drum, a high volume of electrolyte transfer across the cathode drum and a carbon filtration system. The carbon filtration system is pretreated prior to insertion into the apparatus.

By use of the process and the apparatus of the present invention, micro-pore free and inclusion free metal foil is obtainable. The foil exhibits higher ductility than conventionally produced foils.

It is an object of the present invention to provide an electrodeposited metal foil which is essentially pore free and inclusion free.

It is a further object of the present invention to provide an electrodeposited foil which has higher ductility than conventional electrodeposited foils.

It is an object of the present invention to provide a process for producing superior electrodeposited foil.

It is an advantage of the present invention that ultrasonic agitation of the electrolyte is not required.

It is an advantage of the present invention that the electrolyte is additive free.

It is a feature of the present invention to provide carbon filtration of the electrolyte.

It is another feature of the invention to pretreat the carbon filtration system prior to use.

These and other objects, advantages and features will become more apparent from the following description and drawings in which like reference numerals depict like elements.

IN THE DRAWINGS

Figure 1:
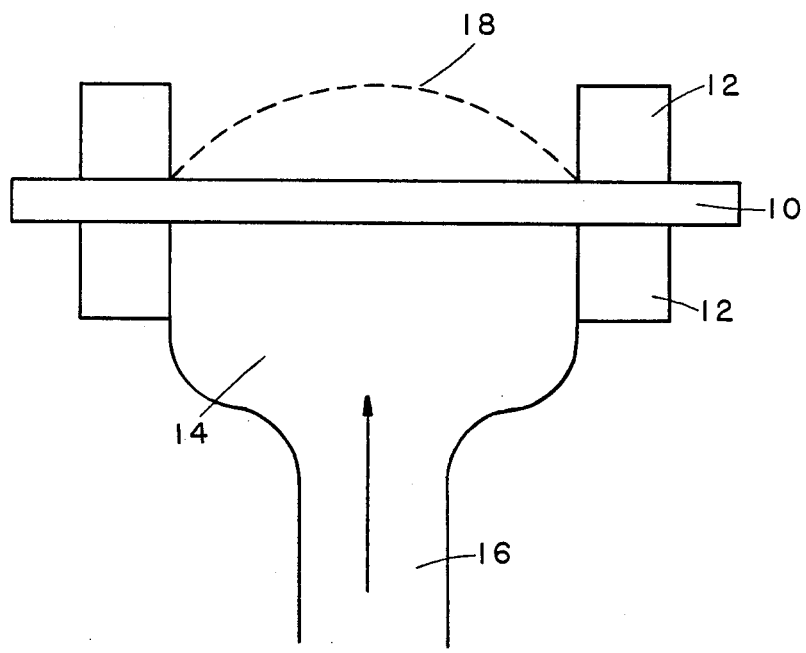
FIG. 1 illustrates a means for applying biaxial tension to a sample of metal foil to determine ductility.

The Institute For Interconnecting and Packaging Electronic Circuits (IPC) (Evanston, Ill.) has devised a series of classifications for electrodeposited foil. Class 3 is defined as high temperature elongation electrodeposited copper foil. Class 3 copper foil is used to form circuit traces in printed circuit boards, particularly for multi-layer circuit boards. Class 3 copper foil is specified as having an elongation of at least 2% in both longitudinal and transverse directions. Elongation is measured both at an elevated temperature of 180° C. and at room temperature (23° C.). Ductility is generally a desired property of the metal foils. For example, copper foil is often bonded to a dielectric carrier, for example, a fiberglass-epoxy, polyimide or ceramic board, and formed into a desired circuit pattern. The circuitry may be formed in the foil by selective chemical etching or by laser scribing. The circuit traces are usually only a few thousandths of an inch wide. Thermal and mechanical stresses are imposed on the narrow foil traces during processing and service. High foil ductility is necessary to prevent breakage at elevated temperatures, that is, from temperatures of about room temperature to about 600° F.

The IPC has also devised a pinhole requirement. For one ounce copper foil, the requirement specifies a maximum of five detectable pin holes per square foot. The longest dimension of any pinhole may not exceed 0.002 inches. Metal foil thickness is typically given in weight per square foot and usually ranges from about 0.5 ounce (about 0.0007 inches thick) to about 2 ounce (about 0.0028 inches thick). Besides the obvious problem of circuit line breaks, pinholes reduce mechanical performance and facilitate resin bleed-through during lamination often times resulting in the scrapping of entire circuit panels.

While conventional foils are acceptable according to the IPC pinhole and elongation requirements, more rigorous testing has determined deficiencies with conventional electrodeposited copper foils which are detrimental to the performance of the foils.

At the onset, a brief definition of the types of voids encountered in metal foil production is necessary.

Pinholes—are holes (on the order of about a few thousandths of an inch in diameter) which extend directly through the foil. A light shined on one side of the foil is often visible on the other side of the foil through pinholes.

Pores, also called "bleeders" or porosity—are smaller defects which extend through the foil through a circuitous path. They usually do not extend straight through the foil and light is not visible through the foil. However, a penetrant dye such as Magnaflux Penetrant SKL-HF (manufactured by Magnaflux Corporation, Chicago, Ill.) will pass through the pore and be visible on the opposite side of the foil. Porosity is believed to result from the interconnection of a series of cracks or micro-pores and thereby complete the path through the foil.

Micro-pores, also referred to as microvoids, are small voids which usually form along the boundaries separating the individual metal grains. Micro-pores do not extend through the foil and do not test positive to either light or penetrant dies. An essentially micro-pore free or micro-void free foil is defined as a foil in which no more than 1 micro-pore having an area greater than or equal to about $5 \times 10^{-8}$ mm$^2$ is present within an area of $1 \times 10^{-5}$ mm$^2$ when observed through a conventional transmission electron microscope at a magnification of at least 6000x.

While most conventional foils are acceptable as to pinholes and pores, only the foil of the present invention is believed to be free of micro-voids and thereby is superior in mechanical properties, particularly at elevated temperatures. A means for evaluating metal foil commonly referred to as the foil bulge test is illustrated in FIG. 1. Unlike the standard methods of measuring elongation which apply a uniaxial load and determine the maximum stress and elongation before failure, the bulge test applies a biaxial stress to the foil. Biaxial stress measurements are believed to be more indicative of the actual foil stress state during fabrication and processing than uniaxial stress measurements. The foil is subjected to biaxial stresses when formed into circuit traces during the manufacture and service life of a printed circuit board. A sheet of metal foil 10 is held in place over an orifice 14 by a fixture 12. An O-ring 15 maintains an pressure tight seal. A gas, typically air, 16 is applied against one side of the foil 10 by means of the orifice 14. The foil inflates by bulging 18 as shown in phantom. By measuring the height of the bulge and the gas pressure required to burst the bulge, the ductility of the foil under biaxial tension may be determined. The test is temperature dependent with elevated temperature testing being more severe since the strength of metals generally decreases with increasing temperatures.

Examination of conventional foils subjected to elevated temperature tensile testing, at temperatures from about 350° F. to about 550° F. revealed failure was typically due to void growth. The voids grow and coalesce as the sample is elongated. Failure of conventional foil results when a series of voids interconnect and a dimple type fracture surface results. When the foil produced in accordance with the teachings of this invention is tested by conventional tensile testing at elevated temperatures, true ductile failure occurs. The foil sample is drawn down to a knife edge prior to failure. There is no evidence of void formation, growth or coalescence.

Figure 2:
FIG. 2 is a transmission electron microscope photomicrograph of electrodeposited copper foil produced in accordance with the present invention.
Figure 3:
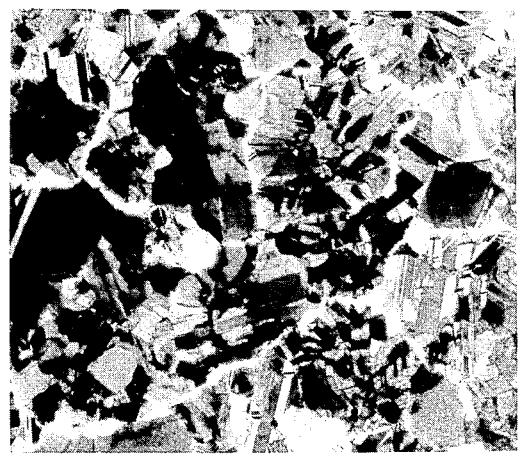
FIG. 3 is a transmission electron microscope photomicrograph of conventionally produced electrodeposited copper foil.

Referring to FIGS. 2 and 3, the improvement of the metal foil in accordance with the invention is seen. FIG. 2 shows a copper foil manufactured by the apparatus of the present invention according to the process of the present invention. The foil has been magnified to 6400X using a transmission electron microscope. No pinholes, pores or micro-pores are detectable.

FIG. 3 is a transmission electron microscope micrograph of conventional copper foil also at a magnification of 6400X. While this foil is acceptable as to pin holes and pores according to the light test and dye penetrant test, the foil bursts at a lower pressure than the foil of FIG. 2. Micro-pores are visible as elongated bright regions at the boundaries between individual copper grains. These micro-pores are not detectable by a dye penetrant test. It is believed the voids do not extend through the foil and are not interconnected to create passageways through the foil.

In accordance with the invention, micropore free copper foil exhibits superior bulge test results compared to the conventional foils tested. As shown in TABLE 1, the foil produced by the present invention exhibits from about 50% to about 100% higher burst pressures.

TABLE 1

| Foil* | Temperature degrees F | Burst Pressure psi |
|---|---|---|
| A | 350 | 52 |
| B | 350 | 79 |
| A | 550 | 25 |
| B | 550 | 57 |
| C | 350 | 49 |
| D | 350 | 61 |

*A = conventional one ounce Class 3 electrodeposited foil
B = one ounce electrodeposited foil according to the present invention
C = conventional one half ounce electrodeposited foil
D = one half ounce electrodeposited foil according to the present invention Spectrographic analysis of the micro-voids usually detected an inclusion of a contaminant. Analysis of the contaminant typically revealed carbon, sodium, potassium or chlorine or a combination of these elements. While not fully understood, it is believed the inclusion of a contaminant was most likely one cause of a void.

A micro-void free and inclusion free electrodeposited foil in accordance with this invention is characterized by the desired properties of high ductility and improved bulge test results at elevated temperatures. A micro-void free and inclusion free copper foil made according to the present invention has been found to have uniaxial tensile elongation values of in excess of about 10% and typically greater than 14%.

Inclusions, impurities and micro-pores are believed to restrain recrystallization. Recrystallization is required for higher ductility. Since the foil produced in accordance with this invention lacks inclusions, impurities and micro-pores, recrystallization and improved ductility takes place at lower temperatures. Significant recrystallization of copper foils occurred at temperatures of about 350° F. during lamination. Conventional copper foils do not exhibit significant recrystallization at this temperature.

Figure 4:
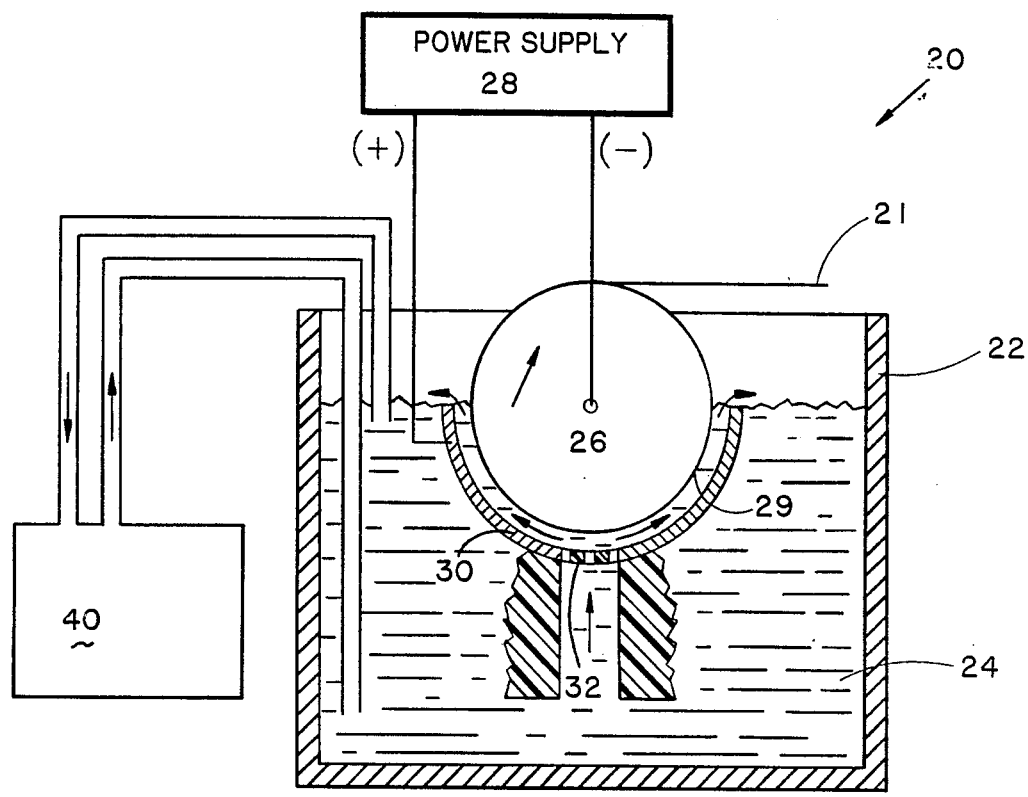
FIG. 4 illustrates an electrolytic cell capable of producing electrodeposited foil in accordance with the present invention.

Referring now to FIG. 4, a process and apparatus for manufacturing the essentially micro-pore free and micro-void free metal foil of the invention is detailed. An electrodeposition system 20 for producing metal foil 21 comprises a plating tank 22 designed to hold electrolyte 24. A rotatable metal drum 26 is connected to a power supply 28. The drum is connected to the negative terminal of the direct current power supply and serves as the cathode. The power supply may be designed to supply constant direct current or pulsed current as disclosed in Polan et al U.S. Pat. No. 4,468,293.

The drum is formed from any suitable electrically conductive metal or metal alloy including but not limited to lead, stainless steel, columbium, tantalum, titanium, chromium and alloys thereof In a preferred embodiment, the drum cathode 26 comprises a stainless steel drum having a plating surface 29 formed from titanium or titanium alloys. The plating surface is preferably finished with an isotropic finish as disclosed in U.S. patent application Ser. No. 161,819. The drum cathode may be rotated by any suitable motor drive system (not shown) known in the art.

An anode 30 preferably has an arcuate shape and a central perforated zone 32. The anode 30 may be formed from any suitable preferably insoluble electrically conductive metal or metal alloy. Preferred anode materials include lead and alloys of lead and antimony or alloys of lead, antimony and silver. Other preferred anode materials include dimensionally stable materials such as platinum clad metals and sintered transition element oxides coating a base material such as titanium. If desired, the central perforated zone 32 may be formed from a different material than the rest of the anode 30. For example, the central perforated zone 32 may be made from a material more resistant to erosion than the material forming the rest of the anode 30. The anode 30 is described in more detail in U.S. Pat. No. 4,529,486, which is hereby incorporated by reference herein.

The anode 30 may be mounted in the tank 22 by any suitable means (not shown) known in the art. Generally, the anode 30 is mounted in a way which provides a substantially uniform interelectrode gap 34 with the moving plating surface 29 of the drum cathode 26. The interelectrode gap 34 is preferably kept small to limit voltage increases due to electrolyte resistance. Ideally, the interelectrode gap should be less than about 50 millimeters. Preferably, the gap 34 is in the range of from about 5 millimeters to about 40 millimeters and most preferably, the gap is from about 10 millimeters to about 30 millimeters.

The electrolyte 24 generally comprises an aqueous solution containing a concentration of metal ions to be deposited on the plating surface 29 of the rotating drum. For example, if copper foil is to be formed, the electrolyte 24 would contain a concentration of copper ions. Alloy plating is a known art and this invention is not limited to electrolytes containing a single species of metal ions. During plating, it is desirable to maintain the electrolyte 24 temperature in the range of from about room temperature to about 100° C. The tank 20 may be provided with any suitable heating and/or cooling device (not shown) known in the art.

As detailed hereinbelow, the purity of the electrolyte must be maintained. To this end, a filtration system 40 is utilized. The filtration system 40 is shown in detail in FIG. 5.

Electrolyte purity and flow rate as well as surface finish of the rotating cathode drum are believed to produce the unexpected and desirable result. The foil so produced is not only essentially micro-void free but free of grain boundary inclusions as well Throughout this specification, the expression "essentially micro-pore free is used". While extensive microscopic analysis to date has failed to detect either a microscopic or macroscopic pore or void as shown in FIG. 2, it may be possible that an occasional void may be present. However, the foil of the present invention is a significant improvement over conventionally produced electrodeposition foils.

In accordance with the present invention, the electrolyte 24 is supplied in an essentially pure condition. No additives either organic or inorganic are added to the electrolyte. On the contrary, all additives and impurities are excluded.

Additives have been found to be deleterious because the additives will degrade in time through reaction with the electrolyte. Degradation also occurs through oxidation at the anode. The reaction products of some additives also appear to degrade foil quality and must be removed from the electrolyte. While conventional techniques are capable of removing a large percentage of the spent additives, no system has been found to remove all the reaction products. Trace amounts of spent additives, on the level of parts per million or even parts per billion, are sufficient to promote micro-void formation or the inclusion of additive species at grain boundaries and a deterioration of foil quality. Therefore, no additives are used in accordance with his invention.

It is desirable to use a pure electrolyte. For example, if copper foil is being produced, an exemplary electrolyte would comprise:

|  | Range | Preferred |
| --- | --- | --- |
| Copper | 5 g/1–60 g/1 | 10 g/1–40 g/1 |
| Sulfuric acid | 10 g/1–100 g/1 | 30 g/1–70 g/1 |
| Temperature | 25° C.–100° C. | 40° C.–60° C. |
| Current density | .1 A/cm$^2$–3 A/cm$^2$ | .8 A/cm$^2$–1.5 A/cm$^2$ |

The copper is generally supplied as copper sulfate or clean, pure copper wire or cupric oxide dissolved in sulfuric acid.

Other exemplary electrolytes include nickel from a Watts type, chloride or fluoroborate electrolyte; copper from cyanide, fluoroborate or pyrophosphate electrolyte; iron from fluoroborate-sulfate solutions; silver from a cyanide solution; and conventional electrolytes used for plating zinc, tin, chromium, alloys thereof or other metals or metal alloys. It has been found especially important to maintain the electrolyte impurity and particulate free. To that end, a filtration and replenishment system as illustrated in FIG. 5 is supplied.

Figure 5:
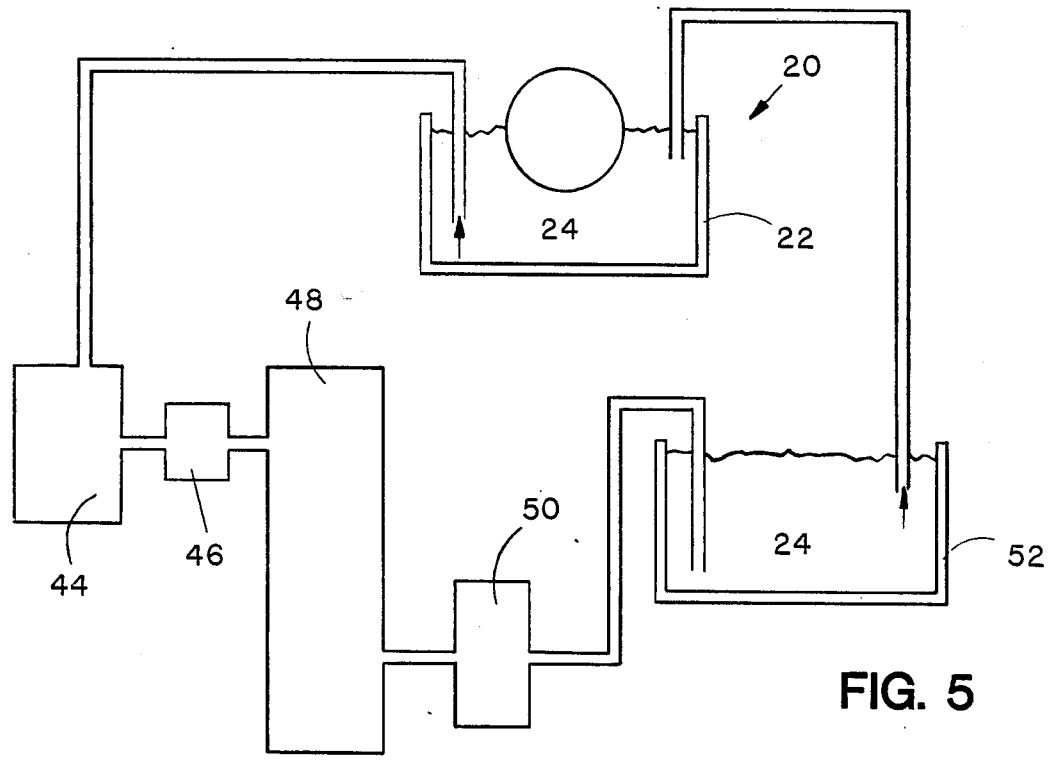
FIG. 5 illustrates by block diagrams the filtration and replenishment system of the present invention.

Referring now to FIG. 5, the electrolyte 24 is continuously filtered through particulate filter 47. Filter 47 has a mesh size of from about 0.5 microns to about 5 microns and preferably from about 0.5 microns to about 3 microns. The filter removes solid particulate matter introduced by anode leaching and adventitious contamination.

The metal foil formation process constantly removes metal ions from the electrolyte. The plating bath 22 must be continuously replenished with fresh metal ion electrolyte 24'. To maintain the proper volume levels, depleted electrolyte 24" is pumped from the plating tank 22 by means of pump 45. Depleted electrolyte 24" and fresh electrolyte 24' are combined in holding tank 52. The proper amount of metal ions are added to the holding tank to achieve a desired concentration. For example, in one exemplary process to produce copper foil, the depleted electrolyte is primarily sulfuric acid. The copper ion concentration is increased by adding copper as either copper metal or copper sulfate to holding tank 52.

The electrolyte 24,' which may either be new material or replenished, flows from the holding tank 52 to a first particulate filter 50. Usually a conventional pumping system 44 is supplied to maintain the electrolyte flow through the filtration system 40. The pumping system 44 is selected to have sufficient capacity to maintain an adequate flow of electrolyte. The particulate filter removes solid particulate matter from the electrolyte which may have been introduced to the electrolyte with the starting materials, anode leaching or by adventitious contamination. The filter mesh must be sufficiently fine to entrap particulate matter, but not sufficiently fine to impact severely on the flow rate of the electrolyte. A filter mesh of from about 1 micron to about 100 microns and most preferably from about 1 micron to about 10 microns has been found acceptable.

The electrolyte next flows into a carbon filter 48. The carbon filter 48 is typically about 6 feet long but may be up to about 20 feet long. The electrolyte flows through the carbon filter at a rate of from about 0.5 gallon/min/ft$^2$ to about 2.0 gallon/min/ft$^2$. A preferred flow rate through the carbon filter is in the range of from about 0.8 gallon/min/ft$^2$ to about 1.2 gallon/min/ft$^2$. The filter 48 is packed with granular activated carbon to maximize the surface area and absorption capability of the carbon. The use of carbon filtration to remove organic contaminants from an electrolyte is known. It has been found that absent pretreatment of the carbon, carbon filtration may introduce chloride or sulfide ions or other impurities into the electrolyte which are deleterious to the properties of the electrodeposited foil. Suitable pretreatment of the granular carbon filter 48 to remove sulfide and chloride ions and other impurities includes leaching the carbon by washing with a sulfuric acid solution followed by a deionized or distilled water rinse. A sulfuric acid concentration of about 2.5% by volume to about 20% by volume is preferred and a most preferred concentration is in the range of from about 5% by volume to about 10% by volume.

The selection of the carbon for the carbon filtration system is important. As chlorides are desirably excluded from the electrolyte, carbons which are prewashed in hydrochloric acid are not recommended. Preferred carbons are manufactured from coconut shells and have a granule size of about 10 to about 60 mesh. Most preferred carbons are prewashed in nitric acid and have a granule size of about 12 mesh to about 30 mesh and an ash content not to exceed 5%. The most preferred carbon may be obtained from Barneby Cheney (Columbus, Ohio) or California Carbon Company, Inc. (Wilmington, Calif.).

The electrolyte next passes through a second particulate filter 46 which removes any carbon granules which may have been swept up by the electrolyte. The second particulate filter 50 preferably has a final stage size of from about 0.5 microns to about 30 microns and preferably from about 1 micron to about 5 micron.

The purified electrolyte 24' is then pumped into the plating tank 22. Impurities, especially organics, sulfides and chlorides are kept in concentrations of less than about 5 parts per million and preferably less than about 1 part per million and most preferably at the limits of detection, in the range of parts per billion.

Referring now back to FIG. 4, the electrolyte 24 is directed against the plating surface 29 of the rotating cathode drum 26 through manifold 54, for example, by a pump (not shown). The flow of electrolyte is controlled to maximize turbulence. The flow rate is at least 0.5 meters per second and preferably in the range of about 1.0 meter per second to about 4 meters per second. The combination of high flow rate and high turbulence is believed to be novel and permits high current densities and increased plating rates. This combination provides for rapid removal of oxygen bubbles The oxygen bubbles are generated at the anode 30 as a by-product of the electrochemical reactions occurring there. The controlled flow of electrolyte reduces the tendency for deposition of the gas bubbles on the plating surface 29 of the rotating cathode drum 26. The bubbles may be occluded in the foil during deposition. Occluded air bubbles are believed to be a source of micro-voids which as discussed above deteriorate the mechanical properties of the foil.

The foil 21 is produced to any desired thickness. For example, unsupported foils as produced using a rotating cathode drum typically have thicknesses from about 0.0005 inches to about 0.015 inches. Preferably, the foil thickness is from about 0.0005 inches to about 0.003 inches. The thickness is controlled by varying the current density and the rotational speed of the cathode drum. The process could also be used for supported foils, for example, those produced by plating on an aluminum carrier. Supported foils may be much thinner than the unsupported foils.

While the plating apparatus, product and process have been described in accordance with metal foil manufactured from a rotating cathode drum, it is recognized other plating systems to produce metal foil are also known, such as a continuous or non-continuous belt. The processes described above are readily applicable to other foil manufacturing techniques known in the art.

The processes and apparatus described above are not limited to manufacturing foil. Methods of plating on a substrate known in the art are also incorporated herein. Plating layers on a substrate are often designed to limited diffusion of the substrate material to the surface of the article, for example to limit corrosion or oxidation or to impart specific electrical or mechanical surface properties. As intergranular diffusion is generally much more rapid than bulk diffusion, a plated diffusion barrier layer with a micro-void free grain boundary structure is believed to reduce the diffusion rate of an underlying substrate. The slower diffusion rate is believed to permit the deposition of a thinner diffusion barrier layer, thereby reducing the cost of plating the barrier layer and enhancing the properties of the underlying substrate, for example, higher thermal conductivity for a copper substrate.

While the intergranular defects have been referred to as micro voids or micro pores through out the specification, the term grain boundary porosity is also applicable. An electrodeposited foil or plated layer made in accordance with the present invention would have significantly lower grain boundary porosity than conventional foils or plated layers.

The patents and patent application set forth in the specification are intended to be incorporated by reference herein.

It is apparent there has been provided in accordance with the invention an apparatus and process for producing essentially pore free and inclusion free metal foil which exhibits substantially improved biaxial ductility than conventional metal foils and which satisfies the objects, features and advantages set forth hereinabove. While the invention has been set forth in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. An essentially micro-pore free and inclusion free electrodeposited copper foil characterized by having no more than one micro-pore having an area greater than or equal to about $5\times10^{-8}$ mm$^2$ present in an area of $1\times10^{-5}$ mm$^2$ when observed at a magnification of at least 6000x.

2. The essentially micro-pore free and inclusion free electrodeposited metal foil of claim 1 wherein said foil has a biaxial stress resistance as measured by the bulge pressure required to burst the foil in excess of about 50 psi at temperatures of less than about 550° F.

3. The essentially micro-pore free and inclusion free electrodeposited metal foil of claim 2 wherein the bulge pressure required to burst the foil is in excess of about 70 psi at temperatures of less than about 350° F.

4. The essentially micro-pore free and inclusion free electrodeposited metal foil of claim 1 wherein said foil has a ductility characterized by an elongation of greater than 10% at a temperature of 75° F. for one ounce copper foil.

5. The essentially micro-pore free and inclusion free electrodeposited metal foil of claim 1 wherein said metal foil is one half ounce copper foil requiring a bulge pressure in excess of 60 psi to burst said foil at temperatures of less than 550° F.

6. The essentially micro-pore free and inclusion free electrodeposited copper foil of claim 1 wherein the thickness of said foil is from about 0.0005 inches to about 0.015 inches.

7. The essentially micro-pore free and inclusion free electrodeposited copper foil of claim 1 wherein the thickness of said foil is from about 0.0005 inch to about 0.003 inch.

8. A process for producing essentially micro-pore free and inclusion free copper foil having improved ductility comprising the steps of:
   providing a tank containing an electrolyte solution;
   providing in said tank a cathode having a continuous plating surface at least partially immersed in said electrolyte solution, said immersed plating surface defining the extent of the plating zone;
   generating a substantially uniform current distribution throughout said plating zone for promoting formation of said substantially uniform metal foil;
   said generating step comprising providing an anode;
   applying a current having a desired current density to said cathode and said anode for plating metal values from said electrolyte solution onto said plating surface;
   filtering said electrolyte so that it is essentially free of chloride and sulfide ions, organic materials and other contaminants and particulates; and
   providing a flow rate of said electrolyte past said cathode sufficient to prevent oxygen accumulation along said cathode.

9. The process of claim 8 including filtering said electrolyte through activated carbon and further including pretreating said activated carbon to remove inorganic impurities.

10. The process of claim 9 including said pretreating step comprises leaching said carbon with a solution containing from about 2.5% by volume to about 20% by volume sulfuric acid.

11. The process of claim 10 including said pretreating step comprises leaching said carbon with a solution containing from about 5% by volume to about 10% by volume sulfuric acid.

12. The process of claim 8 including providing a copper sulfate electrolyte free from organics, chlorides and other additives and contaminants to thereby manufacture a copper metal deposit.

13. The process of claim 8 including providing an electrolyte containing a concentration of metal values of a desired metal.

14. The process of claim 8 including said cathode is a rotating drum.

15. The process of claim 8 including said cathode is an endless belt.

16. The process of claim 8 including the step of recrystallizing the foil so produced by heating said foil to a temperature in excess of 350° F.

* * * * *